(12) United States Patent
Forrest et al.

(10) Patent No.: US 7,889,774 B2
(45) Date of Patent: Feb. 15, 2011

(54) ORGANIC POLARITON LASER

(75) Inventors: Stephen R. Forrest, Princeton, NJ (US); Russell Holmes, Princeton, NJ (US)

(73) Assignee: The Trustees of Princeton University, Princeton, NJ (US)

( * ) Notice: Subject to any disclaimer, the term of this patent is extended or adjusted under 35 U.S.C. 154(b) by 34 days.

(21) Appl. No.: 10/877,640

(22) Filed: Jun. 25, 2004

(65) Prior Publication Data

US 2005/0195874 A1 Sep. 8, 2005

Related U.S. Application Data

(63) Continuation-in-part of application No. 10/793,968, filed on Mar. 5, 2004.

(51) Int. Cl.
*H01S 3/213* (2006.01)
*H01S 3/0933* (2006.01)

(52) U.S. Cl. .......................................... 372/53; 372/70

(58) Field of Classification Search ................. 977/951; 372/53, 70
See application file for complete search history.

(56) References Cited

U.S. PATENT DOCUMENTS

| | | | |
|---|---|---|---|
| 5,182,666 A * | 1/1993 | Kawabe ...................... | 359/107 |
| 5,315,129 A * | 5/1994 | Forrest et al. ................. | 257/21 |
| 6,303,238 B1 | 10/2001 | Thompson et al. | |
| 6,310,360 B1 | 10/2001 | Forrest et al. | |
| 6,639,357 B1 | 10/2003 | Parthasarathy et al. | |
| 6,645,645 B1 | 11/2003 | Adachi et al. | |
| 6,879,618 B2 * | 4/2005 | Cok et al. ..................... | 372/70 |
| 2002/0034656 A1 | 3/2002 | Thompson et al. | |
| 2002/0182441 A1 | 12/2002 | Lamansky et al. | |
| 2003/0072964 A1 | 4/2003 | Kwong et al. | |
| 2004/0028092 A1 * | 2/2004 | Kim ............................ | 372/20 |
| 2005/0031005 A1 * | 2/2005 | Cheng et al. .................. | 372/68 |
| 2005/0037232 A1 * | 2/2005 | Tyan et al. .................... | 428/690 |

FOREIGN PATENT DOCUMENTS

WO WO-02/074015 9/2002

OTHER PUBLICATIONS

"Stimulated emission of exiton polaritons in a semiconductor microcavity" Tassone et al. May 4, 1998.*
V.G. Kozlov et al., "Conf. On Lasers and Electro-optics CLEO '97, CPD-18," Opt. Soc. Am., Baltimore, MD (1997).
V.G. Kozlov et al., "Unique optical properties of organic lasers, CLEO '98," San Francisco (1998).
V.G. Kozlov et al., "Temperature Independent Performance of Organic Semiconductor Lasers," Appl. Phys. Lett., vol. 71, pp. 2575 (1997).

(Continued)

*Primary Examiner*—Minsun Harvey
*Assistant Examiner*—Marcia A. Golub-Miller
(74) *Attorney, Agent, or Firm*—Kenyon & Kenyon LLP

(57) ABSTRACT

The present invention relates to organic lasers. More specifically, the present invention is directed to an organic laser that provides a self-stimulated source of coherent radiation originating from organic microcavity polaritons. The organic polariton laser of the present invention comprises a substrate, a resonant microcavity comprising an organic polariton emission layer; and an optical pump. In preferred embodiments the optical pump is a microcavity OLED allowing for the fabrication of a self-contained or integrated device.

16 Claims, 9 Drawing Sheets

OTHER PUBLICATIONS

M. Baldo et al., "Prospects for electrically pumped organic lasers," Pys. Rev. B., vol. 66, pp. 035321 (2002).

V.G. Kozlov et al., "Structures for Organic Diode Lasers and Optical Properties of Organic Semiconductors Under Intense Optical and Electrical Excitations," IEEE J. Quant. Electron., vol. 36, pp. 18 (2000).

C. Weisbuch et al., "Observation of the coupled exciton-photon mode splitting in a semiconductor quantum microcavity," Physcial Review Letters, vol. 69, pp. 3314 (1992).

N. Takada et al., "Polariton emission from polysilane-based organic microcavities," Applied Physics Letters, vol. 82, pp. 1812 (2003).

P. Schouwink et al., "Observation of strong exciton-photon coupling in an organic microcavity," Chemical Physics Letters, vol. 344, pp. 352 (2001).

D. G. Lidzey et al., "Strong exciton-photon coupling in an organic semiconductor microcavity," Nature (London), vol. 395, pp. 53 (1998).

G. Malpuech et al., "Room-temperature polariton lasers based on GaN microcavities," Applied Physics Letters, vol. 81, pp. 412 (2002).

P. G. Savvidis et al., "Angle-Resonant Stimulated Polariton Aplifier," Physical Review Letters, vol. 84, pp. 1547 (2000).

J. Erland et al., "Stimulated secondary emission from semiconductor microcavities," Physical Review Letters, vol. 86, pp. 5791, (2001).

M. Saba et al., "High-temperature ultrafast polariton amplifier," Nature (London), vol. 414, pp. 731 (2001).

M. S. Skolnick et al. "High-Occupancy Effects and Stimulation Phenomena in Semiconductor Microcavities," IEEE Journal of Selected Topics in Quantum Electronics, vol. 8, pp. 1060 (2002).

R. Houdre et al. "Measurement of Cavity-Polariton Dispersion Curve from Angle-Resolved Photoluminescence Experiments," Phys. Rev. Lett., vol. 73, pp. 2043 (1994).

M.S. Skolnick et al., "Strong Coupling Phenomena in Quantum Microcavity Structures," Semicond. Sci. Technol., vol. 13, pp. 645 (1998).

T. Fujita et al., "Tunable Polariton Absorption of Distributed Feedback Microcavities at Room Temperature," Phys. Rev. B 57, 12428(1998).

D. G. Lidzey et al., "Room Temperature Polariton Emission from Strongly Coupled Organic Semiconductor Microcavities," Phys. Rev. Lett., vol. 82, pp. 3316 (1999).

S. R. Forrest, "Ultrathin Organic Films Grown by Organic Molecular Beam Deposition ad Related Techniques," Chem. Rev., vol. 97, pp. 1793 (1997).

S. R. Forrest et al., "Organic-on-inorganic semiconductor contact barrier diodes. II. Dependence on organic film and metal contact properties," J. Appl. Phys., vol. 56, pp. 543 (1984).

J. Wainstain et al. "Dynamics of Polaritons in a Semiconductor Multiple-Quantum-Well Microcavity," Phys. Rev. B., vol. 58, pp. 7269 (1998).

D. G. Lidzey et al., "Photon-Mediacted Hybridization of Frenkel Excitons in Organic Semiconductor Microcavities," Science, vol. 288, pp. 1620 (2000).

A. Armitage et al., "Polariton[-Induced Optical Asymmetry in Semiconductor Microcavities," Phys. Rev. B, vol. 58, pp. 15367 (1998).

V. M. Agranovich et al., "Cavity polaritons in microcavities containing disordered organic semiconductors," Phys. Rev. B, vol. 67, pp. 085311 (2003).

* cited by examiner

ORGANIC POLARITON LASER

RELATED APPLICATIONS

This application is a continuation-in-part of pending application Ser. No. 10/793,968, filed on Mar. 5, 2004, which is incorporated herein by reference in its entirety.

GOVERNMENT RIGHTS

This invention was made with Government support under Contract No. F49620-00-1-0065, awarded by the Air Force Office of Scientific Research. The government has certain rights in this invention.

RESEARCH AGREEMENTS

The claimed invention was made by, on behalf of, and/or in connection with one or more of the following parties to a joint university-corporation research agreement: Princeton University, The University of Southern California, and Universal Display Corporation. The agreement was in effect on or before the date the claimed invention was made, and the claimed invention was made as a result of activities undertaken within the scope of the agreement.

FIELD OF THE INVENTION

The present invention relates to organic lasers. More specifically, the present invention is directed to an organic laser that provides a self-stimulated source of coherent radiation originating from organic microcavity polaritons.

BACKGROUND

The past fifteen years have seen an explosive growth of research interest in the study and application of organic materials as the active media in organic opto-electronic devices. Today, this work has culminated with organic light emitting devices (OLEDs), and specifically phosphorescent OLEDs. Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate.

Lasing action has been demonstrated in an organic laser having optically-pumped slab waveguide structures of vacuum-deposited thin films of small molecular weight organic semiconductors. V. G. Kozlov et al., *Conf: on Lasers and Electro-optics CLEO '97*, CPD-18, Opt. Soc. Am., Baltimore, Md., May 1997. Lasing from molecular organic as well as polymeric thin films has been shown to span the visible spectrum, extending into the near IR simply by making modifications to the lasing medium [V. G. Kozlov, V. Bulovic, P. E. Burrows, V. Khalfin, and S. R. Forrest, "Unique optical properties of organic lasers," presented at CLEO '98, San Francisco, 1998]. More importantly, the characteristics of organic lasers are remarkably temperature independent [V. G. Kozlov, V. Bulovic, and S. R. Forrest, "Temperature Independent Performance of Organic Semiconductor Lasers," Appl. Phys. Lett., vol. 71, pp. 2575, 1997]. For example, the temperature dependence of a DCM2 doped $Alq_3$ optically pumped organic thin film laser is compared to a GaAs-based laser. The threshold for optically pumped lasing, as well as the lasing wavelength of a molecular organic thin film as a function of temperature show minimal temperature dependence, in contrast to a conventional GaAs-based laser. The almost complete lack of change in these parameters (including slope efficiency) is due to the isolated, quantum nature of the excited state in organic thin films. These molecular states are largely isolated from those of the environment, leading to lack of sharing of electrons in broad energy bands as occurs in inorganic semiconductors.

It is becoming increasingly apparent that the conventional techniques applied to achieving electrically induced laser emission in inorganic semiconductors, such as the use of an intensely pumped double heterostructure, may not be suited for the successfully generation of the laser emission in organic semiconductors. In organic materials, losses related to thin film resistance, polaron quenching and absorption, and singlet exciton annihilation may ultimately prohibit an organic thin film from reaching the lasing threshold by conventional approaches. [M. A. Baldo, R. J. Holmes, and S. R. Forrest, "Prospects for electrically pumped organic lasers," Phys. Rev. B, vol. 66, pp. 035321, 2002; V. G. Kozlov, G. Parthasarathy, P. E. Burrows, V. B. Khalfin, J. Wang, S. Y. Chou, and S. R. Forrest, "Structures for Organic Diode Lasers and Optical Properties of Organic Semiconductors Under Intense Optical and Electrical Excitations," IEEE J. Quant. Electron., vol. 36, pp. 18, 2000].

Perhaps the most promising and least explored option involves exploiting cavity polariton formation in organic materials embedded in high Q dielectric microcavities for the generation of coherent radiation. The study of microcavity polaritons in conventional inorganic semiconductors has been intensive since their initial discovery in GaAs in 1992 [C. Weisbuch, M. Nishioka, A. Ishikawa, and Y. Arakawa, "Observation of the coupled exciton-photon mode splitting in a semiconductor quantum microcavity," Physical Review Letters, vol. 69, pp. 3314, 1992]. Recently, microcavity polaritons in organic materials have been described [N. Takada, T. Kamata, and D. D. C. Bradley, "Polariton emission from polysilane-based organic microcavities," Applied Physics Letters, vol. 82, pp. 1812, 2003; P. Schouwink, H. V. Berlepsch, L. Dahne, and R. F. Mahrt, "Observation of strong exciton-photon coupling in an organic microcavity," Chemical Physics Letters, vol. 344, pp. 352, 2001; D. G. Lidzey, D. D. C. Bradley, M. S. Skolnick, T. Virgili, S. Walker, and D. M. Whittaker, "Strong exciton-photon coupling in an organic semiconductor microcavity," Nature (London), vol. 395, pp. 53, 1998].

SUMMARY OF THE INVENTION

The present invention provides an organic polariton laser comprising a substrate, a resonant microcavity comprising an organic polariton emission layer; and an optical pump. In preferred embodiments the optical pump is a microcavity OLED allowing for the fabrication of a self-contained or integrated device.

DETAILED DESCRIPTION

The present invention is directed to an organic laser that provides a self-stimulated source of coherent radiation originating from organic microcavity polaritons. The organic polariton lasers of the present invention represent a device with the functionality of a conventional laser, but with considerably different underlying physics. The organic polariton laser comprises a substrate, a resonant microcavity comprising an organic polariton emission layer, and an optical pump.

Figure 2:
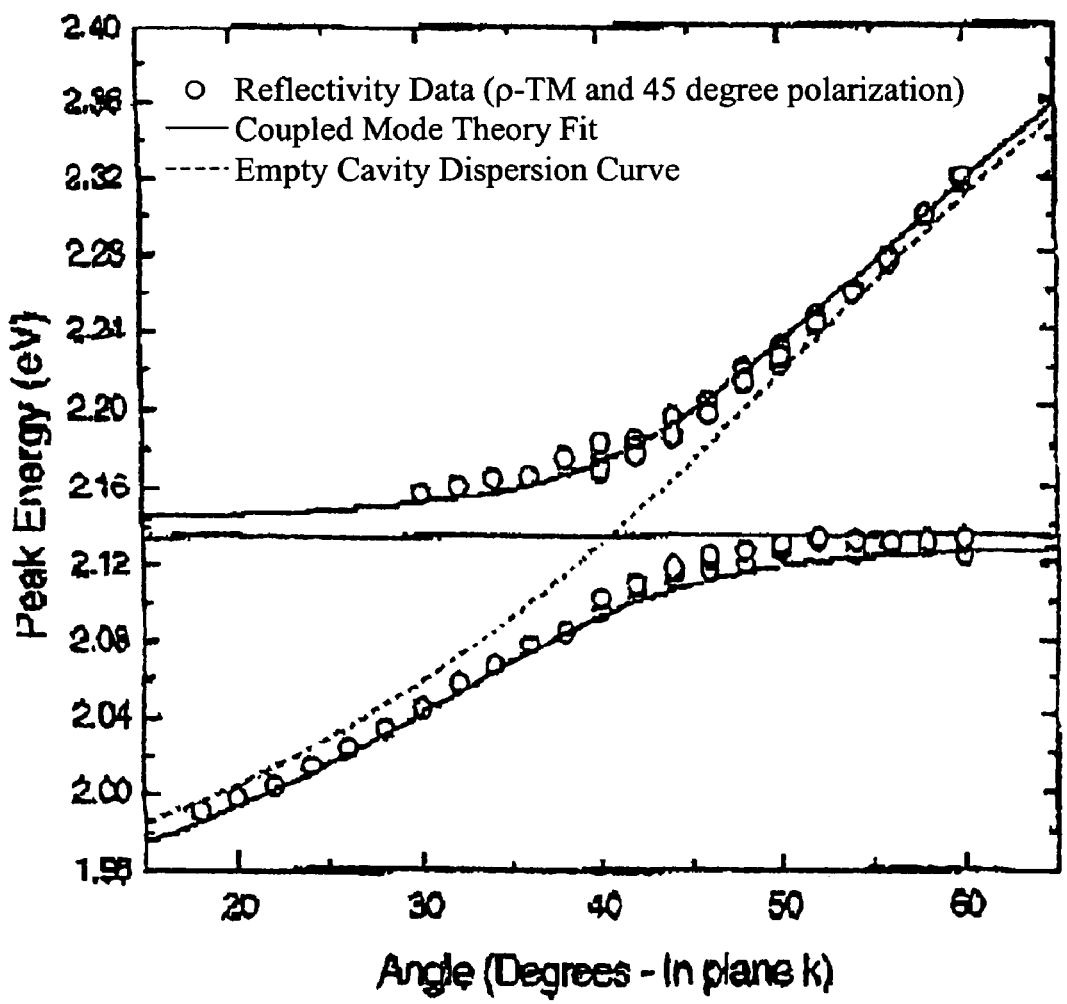
FIG. 2 shows the dispersion relation measured for an organic microcavity containing pseudoisocyanine. The "peak energy" refers to the location of the resonances observed in the reflection spectrum of the structure, corresponding to the coupled exciton-photon eigenstates.

A polariton is a quasi-particle that is an eigenstate of a strongly coupled exciton-photon system. This strong coupling generally occurs with the help of an external microcavity whose resonant frequency is tuned close to the exciton absorption resonance. The active lasing material is generally confined between two mirrors of high reflectivity (for example, distributed Bragg reflectors) and frequently also in at least one quantum well, thus reducing the dimensionality of excitons in the material. In such a system, excitons and photons become strongly coupled as polaritons, with the new dispersion relation of the system being different from both that of the individual exciton and photon, as illustrated by the dispersion of a cavity polariton in a pseudoisocyanine dye (see FIG. 2). Both theory and experiment suggest that the charge neutral polariton should behave as a boson, implying that stimulated scattering (leading to gain) as well the phenomena of macroscopic condensation and coherence should be observable. In fact, a number of experiments using III-V and II-VI semiconductors have reported the observation of stimulated scattering in various forms with some reports, attributing similar observations to the formation of a non-equilibrium Bose-condensation.

Organic microcavities may be exceptionally well suited for the exploitation of the coupled exciton-photon state in a low (or even zero) threshold laser. In inorganic materials, the exciton binding energy is intrinsically so low (~10 meV) that excitons, and hence polaritons, only exist at low temperature. There are exceptions to this rule with materials such as GaN, ZnO and ITO, where the exciton binding energy is large enough that the polariton state should be observable at room and even at elevated temperatures. [G. Malpuech, A. Di Carlo, A. Kavokin, J. J. Baumberg, M. Zamfirescu, and P. Lugli, "Room-temperature polariton lasers based on GaN microcavities," Applied Physics Letters, vol. 81, pp. 412, 2002]. However, polaritons in organic microcavities may still hold greater promise due to their large binding energy (~1 eV).

To date, the most promising work involving polaritons has been the demonstration of bosonic stimulated scattering and optical gain under resonant optical excitation [P. G. Savvidis, J. J. Baumberg, R. M. Stevenson, M. S. Skolnick, D. M. Whittaker, and J. S. Roberts, "Angle-Resonant Stimulated Polariton Amplifier," Physical Review Letters, vol. 84, pp. 1547, 2000]. Stimulated scattering refers to the tendency of bosons to populate final states whose population is greater than unity. This final state stimulation forms the basis for conventional laser operation, where photon emission is stimulated by the large scale occupation of photon modes in the cavity. Resonant excitation refers to the situation where polaritons are generated with an energy and in-plane wavevector matched to those at the inflection point of the lower branch of the polariton dispersion relation. For a stimulated scattering event to occur, momentum must be conserved. Thus, if polaritons of momentum $k_p$ scatter with one polariton ending up in the k=0 state, the others must end up in the k=2 $k_p$ state to conserve momentum. This momentum conservation is observed by detecting photoluminescence from both the k=0 state and the k=2 $k_p$ state.

Resonant excitation may be used to demonstrate stimulated scattering and gain using polaritons. The same result may be achieved using non-resonant excitation. Non-resonant excitation refers to the case where polaritons have arbitrary energy and in-plane wavevector, similar to what would be expected under electrical excitation. If the case of non-resonant excitation is considered, assume excitons are generated at high k, and permitted to reduce their energy and in-plane wavevector through the emission of longitudinal optical phonons. This initial phonon emission occurs rapidly in conventional semiconductors (<1 ps) [M. S. Skolnick, A. I. Tartakovskii, R. Butte, D. M. Whittaker, and R. M. Stevenson, "High-Occupancy Effects and Stimulation Phenomena in Semiconductor Microcavities," IEEE Journal of Selected Topics in Quantum Electronics, vol. 8, pp. 1060, 2002], and is followed by a slower acoustic phonon emission process until excitons fall into the region of the dispersion curve referred to as the "exciton reservoir", occurring on the high k side of the region of strongest coupling (and hence highest polariton-like character). The challenge to generating gain non-resonantly arises at this point. Below the exciton reservoir, there exists a "bottleneck" toward population of the low k states that results from the competition between phonon-assisted polariton relaxation from the exciton reservoir (~1 ns) and the increasing escape rate for polaritons from the microcavity as the dispersion curve becomes increasingly photon-like.

The relaxation bottleneck effects the ability to populate states of low k. When the excitation is increased, the bottleneck is suppressed, and the peak photoluminescence intensity peaks at low k. Further increases in excitation should provide for increased suppression of the bottleneck due to increased polariton-polariton and polariton-exciton scattering.

Optical gain and the possibility for self-stimulated coherent emission become possible when the polariton bottleneck is suppressed. In the case of resonant excitation, the bottleneck is automatically eliminated since polaritons are created with an in-plane wavevector that is less than that included in the exciton reservoir, meaning that the polaritons have already effectively bypassed the bottleneck. With the bottleneck no longer a concern, scattering can allow for a significant population to build up at k=0. More difficult to achieve is the self-stimulated case reported under both pulsed [J. Erland, V. Mizeikis, W. Langbein, J. R. Jensen, and J. M. Hvam, "Stimulated secondary emission from semiconductor microcavities," Physical Review Letters, vol. 86, pp. 5791, 2001] and continuous wave excitation, where a sufficiently large population builds up a k=0 such that the emission from polaritons stimulates the remaining polaritons in the k=0 state to radiate. Such a situation is analogous to a self-stimulated polariton laser. No threshold needs to be established in this polariton laser, and the polaritonic system is in a regime of strong exciton-photon coupling, while a conventional laser operates in the weak coupling regime. The similarity with the conventional laser comes primarily from the coherent light output.

Resonant excitation has allowed for the generation of gains up to 5000 in semiconductor microcavities [M. Saba, C. Ciuti, J. Bloch, V. Thierry-Mieg, R. Andre, L. S. Dang, S. Kundermann, A. Mura, G. Bongiovanni, J. L. Staehli, and B. Deveaud, "High-temperature ultrafast polariton amplifier," Nature (London), vol. 414, pp. 731, 2001]. However, for these phenomena to be applicable to lasing, gain under non-resonant excitation needs to be demonstrated. As has already been described, the challenge to achieving gain; or self-stimulated coherent emission is the overcoming of the polariton bottleneck. Skolnick et al. [M. S. Skolnick, A. I. Tartakovskii, R. Butte, D. M. Whittaker, and R. M. Stevenson, "High-Occupancy Effects and Stimulation Phenomena in Semiconductor Microcavities," IEEE Journal of Selected Topics in Quantum Electronics, vol. 8, pp. 1060, 2002] addressed this, noting that as the pump intensity is increased, the effect of the bottleneck is lessened as a result of increased polariton-polariton and polariton-exciton scattering, allowing for the de-excitation of the polariton to lower k states, and ultimately to the k=0 state. The limitations to this approach is that as the pump intensity is increased in a conventional semiconductor, excitons dissociate into electron-hole pairs (destroying the strong coupling) and also tend to screen each other at large densities, again dissociating the excitons into electron-hole pairs, resulting in the loss of strong coupling.

Organic materials are an excellent candidate to use in suppressing the relaxation bottleneck. Since organic materials can be chosen to consist of tightly bound Frenkel excitons, with binding energies on the order of 1 eV, they should allow strong coupling to persist up to the high pump powers necessary to increase polariton scattering. Additionally, as a result of the large Rabi splittings (i.e. branch splittings) observed for organic microcavity polaritons (~100 meV compared to <10 meV for inorganic semiconductors), and the large exciton binding energies associated with Frenkel excitons, the strong coupling should be very robust, even at room temperature, in stark contrast with the inorganic semiconductors.

Figure 1:
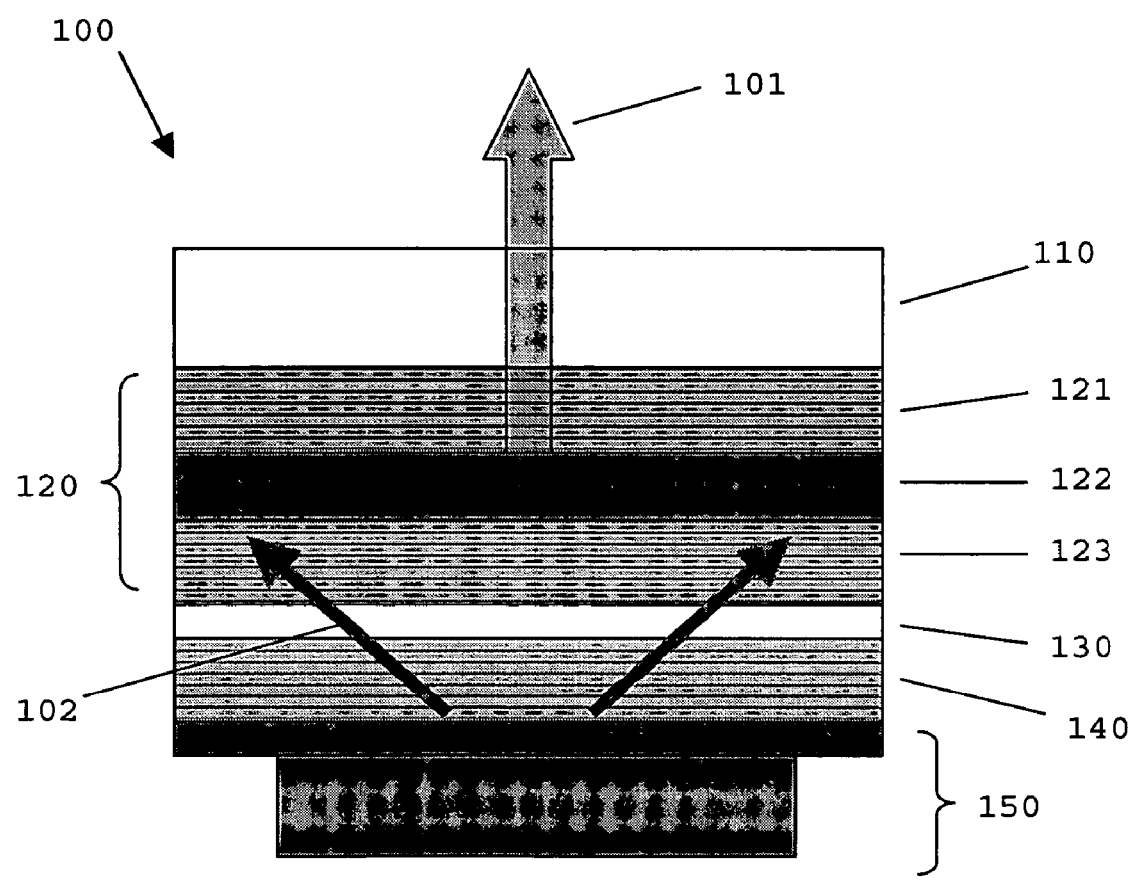
FIG. 1 shows a schematic diagram of a resonant organic polariton laser.

FIG. 1 shows an organic polariton laser 100. The figures are not necessarily drawn to scale. Device 100 may include a substrate 110, a resonant microcavity 120 comprising an organic polariton emission layer 122, and an optical pump 150. The microcavity may be comprised of a first reflective layer and a second reflective layer 121 and 123, adjacent to the organic polariton emission layer 122. The organic polariton laser may further comprise a dielectric spacer 130. In preferred embodiments the optical pump 150 comprises a microcavity OLED. The use of an OLED for the optical pump allows for the construction of a "self-contained" or integrated device. Device 100 may be fabricated by depositing the layers in order.

The Substrate 110 may be made of any transmissive material that provides the desired structural properties. "Transmissive" as used herein indicates that light of the wavelengths emitted by the structure (101) is transmitted through the substrate material without substantial loss of amplitude, and preferably with substantially no loss of amplitude. Glass, plastic and quartz are examples of preferred substrate materials. The material and thickness of substrate 110 may be chosen to obtain desired structural and optical properties.

The microcavity 120 comprises an organic polariton emission layer within a resonant microcavity structure. The microcavity is designed to enhance light-matter interactions. The organic polariton emission layer is generally confined between two mirrors of high reflectivity (for example, distributed Bragg reflectors) and frequently also in at least one quantum well, thus reducing the dimensionality of excitons in the material. In such a system, excitons and photons become strongly coupled as polaritons. In one embodiment the microcavity comprises a first reflective layer and a second reflective layer, 121 and 123. The reflective layers should have a high reflectivity. The resulting cavities should have a high Q, preferably greater than about 500. In a preferred embodiment the reflective layers are comprised of distributed Bragg reflectors (DBRs).

Distributed Braggs reflectors are periodical structures made up of two semiconductor or dielectric materials having different refractive indices. Preferred materials for DBR layers include $TiO_2/SiO_2$ multilayer stacks, although other DBR materials may be used. The gratings may be fabricated by sputter deposition or plasma deposition, and monitored in situ using ellipsometry as they are deposited. Additionally, the dielectric materials may be deposited by thermal evaporation. The reflective layers may be designed with the typical DBR requirement in mind, namely that the thickness of each dielectric layer be equal to the wavelength of light to be reflected divided by 4 times the index of refraction of the dielectric material at said wavelength (wavelength/(4×n)).

The effective length of the microcavity should be equal to an integer number of half wavelengths (m×wavelength/2) of the light to be confined (where m is an integer and the wavelength is that of the light in the material). Additionally, the photon should experience no net phase shift upon a round trip through the cavity at resonance.

The organic polariton layer 122 comprises an organic material. These compounds are characterized by a very small Franck-Condon shift—i.e. the emission and absorption spectra strongly overlap, creating coupling between the photon (in the absorption spectrum) and the exciton (whose characteristic emission overlaps absorption). For strong coupling to occur, narrow absorption features may be required, implying long exciton lifetimes during which coupling to the cavity photon can occur. The organic polariton emission medium may be comprised of, for example, compounds that form J aggregates, such as cyanine dyes. Examples of suitable materials include a psuedoisocyanine and 1,1'-dialkyl-2,2'-cyanines, transition metal porphyrins (e.g. phenyl-porphyrin zinc) and a-conjugated polysilanes (e.g. poly(n-butylphenyl-silane)). Other materials include polyaromatic cyclic anhydrides, such as 3,4,7,8-naphthalene dianhydride (NTCDA). However, other materials that demonstrate strong coupling may be used.

In one embodiment, the organic polariton layer comprises an organic material that is deposited by a thermal evaporation technique. The resulting layer of organic material may form a crystalline or polycrystalline layer.

Device 100 may include a dielectric spacer 130. The dielectric spacer layer may be included as a means to reduce damage to the polariton DBR stack from the deposition of the OLED DBR stack. Additionally, the dielectric spacer may function as a means of tuning the outcoupling properties of the OLED into the polariton stack. The only requirement for the dielectric spacer layer is that it must be transparent to the light emitted from the OLED. Materials which may be appropriate for use in the dielectric spacer includes silicon oxide, silicon nitride, lithium fluoride, tellurium oxide, titanium oxide, etc.

Any light emitting device may be used as the pump source, so long as the emitted light is of sufficient intensity and the wavelength is appropriate to match the resonance of the polaritons generated in the organic polariton emission layer. In a preferred embodiment, an OLED is employed as the optical pump 150. An OLED pump is preferred as they can be fabricated on top of other devices at room temperature. The OLED pump is generally inexpensive to fabricate and allows for the construction of an integrated device.

Figure 3:
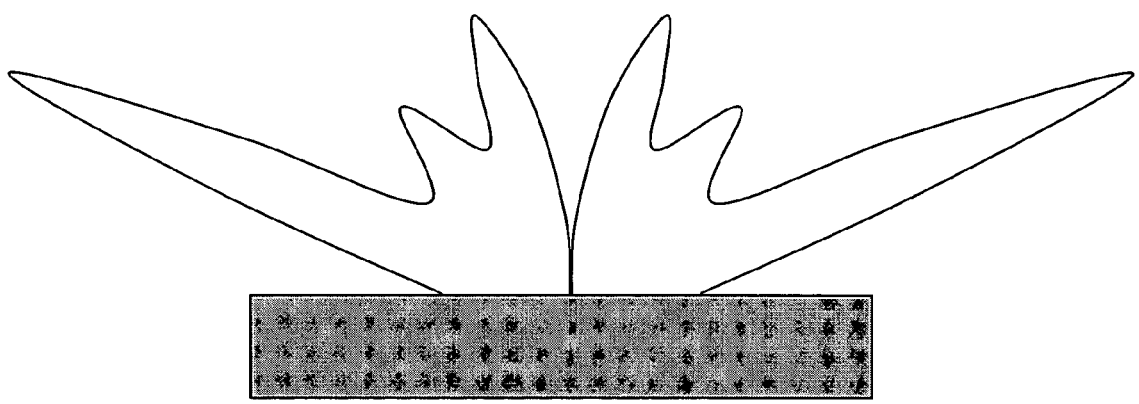
FIG. 3 shows the calculated emission pattern of a microcavity OLED.

In a preferred embodiment, the pump source comprises a microcavity emitting OLED. The microcavity emitting OLED comprises an OLED structure 150 and a DBR 140. The OLED DBR is detuned from the DBRs of the microcavity 120. The output of the microcavity emitting OLED, represented by the arrows 102, is focused at the correct angle (resonance angle) to match the resonance of the polariton microcavity. The OLED DBR is tuned so that the maximum emission emerges at a k-value equal to that needed to pump the polariton medium at the inflection point of its dispersion curve. A calculated angular emission pattern from such a microcavity OLED is shown in FIG. 3. The microcavity OLED can focus a significant amount of light intensity into the desired angle. The OLED cavity (DBR) should be tuned to generate the maximum number of polaritons in the upper cavity 120 such that gain and transparency can be achieved.

The selection of a particular OLED structure or emissive material depends on the material selected to exhibit strong coupling. Thus, the only general requirement for the OLED is that it be of the highest possible quantum efficiency and that its output spectrum overlap with the absorption spectrum of the active material of the organic polariton emission medium for resonant or non-resonant excitation (depending on which scheme is desired). Materials and methods for the fabrication of the OLED are known in the art, such as those disclosed in U.S. Pat. Nos. 6,645,645, 6,639,357, 6,303,238 and 6,310,360; and U.S. Patent Application Publication Nos. 2002-0034656; 2002-0182441; and 2003-0072964; and WO-02/074015, each of which is incorporated herein by reference in their entirety.

Techniques for depositing the materials used in the embodiments of the present invention are well known in the art. For example, a preferred method of depositing organic layers is by thermal evaporation; a preferred method of depositing metal layers is by thermal or electron-beam evaporation; a preferred method of depositing ITO is by electron-beam evaporation or sputtering. However, the present invention contemplates the use of any suitable method of depositing layers of material.

In one embodiment of the invention, the first polariton cavity DBR is grown onto a glass substrate. The gratings may be fabricated by sputter deposition or plasma deposition, and monitored in situ using ellipsometry as they are deposited. Next, the organic polariton emission medium, for example a psuedoisocyanine which forms J aggregates, is deposited. Then a second DBR stack is deposited finishing the high Q cavity. Next, a dielectric spacer is grown. The device is completed by fabricating a microcavity emitting OLED onto the polariton cavity surface. This begins by depositing a third DBR detuned from the DBRs of the polariton structure. Then an ITO anode is sputtered onto the OLED DBR, followed by a high intensity OLED layer structure, finishing up with a metal cathode.

In another embodiment, a non-resonant polariton laser may be fabricated, which differs from the resonant device in that the OLED DBR can be omitted. Without resonance, there is no strong angular dependence of the pump light; hence the simple Lambertian pattern of a standard OLED.

Devices fabricated in accordance with embodiments of the invention may be incorporated into a wide variety of consumer products, including communications devices, printers, etching systems, measuring devices, optical memory devices, display devices, and sensor devices. The devices of the invention may also be employed as wavelength references for wavelength division multiplexing, optical heterodyning and optical clock applications. Many of the devices are intended for use in a temperature range comfortable to humans, such as 18 degrees C. to 30 degrees C., and more preferably at room temperature (20-25 degrees C.).

It is understood that the various embodiments described herein are by way of example only, and are not intended to limit the scope of the invention. For example, many of the materials and structures described herein may be substituted with other materials and structures without deviating from the spirit of the invention. It is understood that various theories as to why the invention works are not intended to be limiting. For example, theories relating to charge transfer are not intended to be limiting.

While the present invention is described with respect to preferred embodiments, it is understood that the present invention is not limited to these embodiments. The present invention as claimed therefore includes variations from the preferred embodiments described herein, as will be apparent to one of skill in the art.

EXAMPLES

Example 1

Figure 4:
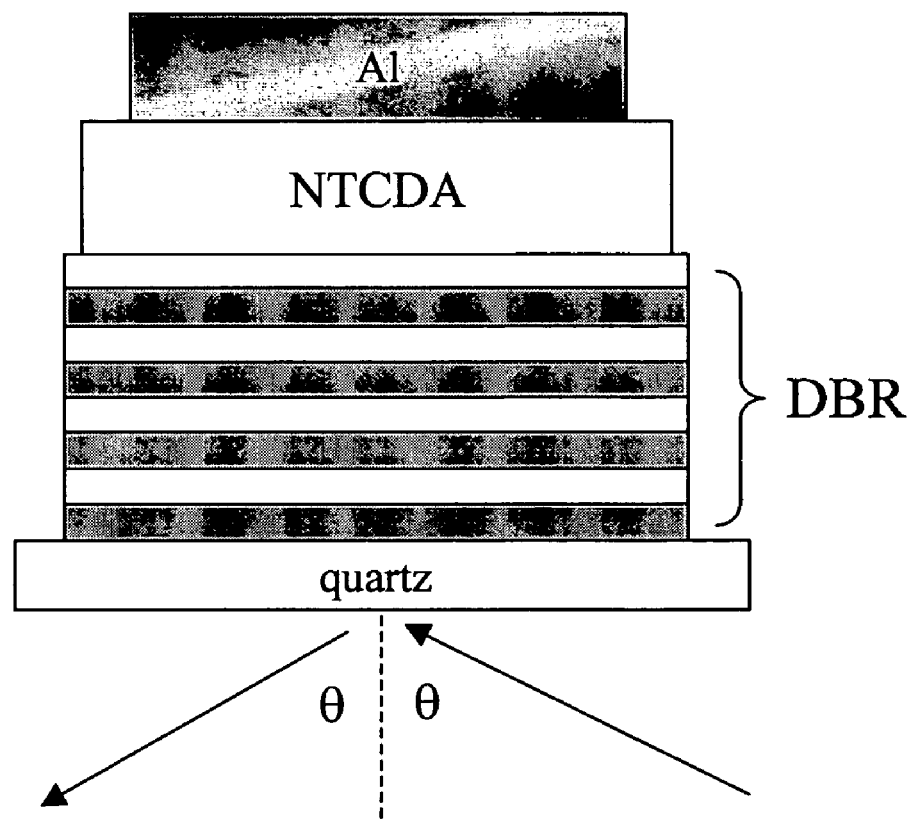
FIG. 4 shows an optical microcavity having a quartz substrate, a microcavity comprising NTCDA, a DBR stack of alternating layers of $SiO_2$ and $SiN_x$ and an aluminum cap.

An OMCs completely filled with the thermally evaporated polycrystalline material 3,4,7,8 napthalenetetracarboxylic dianhydride (NTCDA) was prepared and exhibited strong coupling and the hybridization of excitons arising from separate vibronic transitions characteristic of this molecular species. Distributed Bragg reflectors (DBR) consisting of 8 pairs of quarter wavelength thick $SiO_2$ and $SiN_x$ layers were deposited on quartz substrates using plasma enhanced chemical vapor deposition, yielding a peak reflectivity of 90%. A polycrystalline film of NTCDA was deposited onto the DBR mirror by sublimation at $10^{-7}$ Torr, forming a cavity between the DBR and a 200 nm Al cap deposited onto the NTCDA surface by thermal evaporation. (See FIG. 4). The dispersion relation of each OMC was determined by using angularly resolved reflection spectroscopy, measuring sample reflectivity as a function of excitation wavelength and angle (R. Houdre, C. Weisbuch, R.P. Stanley, U. Oesterle, P. Pellandini, and M. Ilegems, Phys. Rev. Lett. 73, 2043 (1994)). Angular reflectivity spectra were collected under illumination through the quartz substrate with p-polarized, monochromated white light using a spectroscopic ellipsometer at room temperature.

Figure 6:
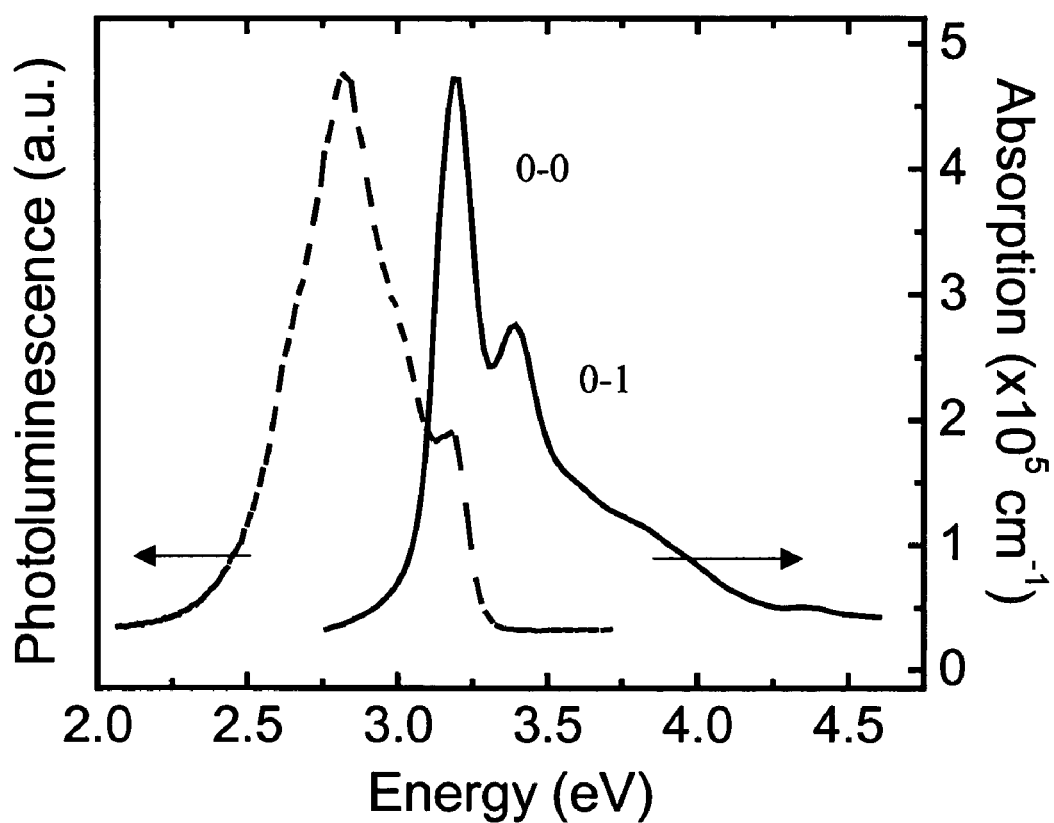
FIG. 6 shows the room temperature photoluminescence and absorption spectra for NTCDA. Absorption peaks at 3.19 and 3.39 eV are designated as the 0-0 and 0-1 transitions.

FIG. 6 depicts the room temperature absorption coefficient and photoluminescence (PL) emission spectrum of an NTCDA film. The full-width at half-maximum linewidths of the 0-0 (3.19±0.05 eV) and 0-1 (3.39±0.05 eV) transitions are (145±5) meV and (138±5) meV, respectively, while the Stokes shift between the 0-0 absorption and emission lines is approximately 30 meV. The 0-0 and 0-1 transitions arise from absorption from the $S_0$ ground state vibronic level to either the lowest or first vibronic level of the $S_1$ excited state.

Figure 5:
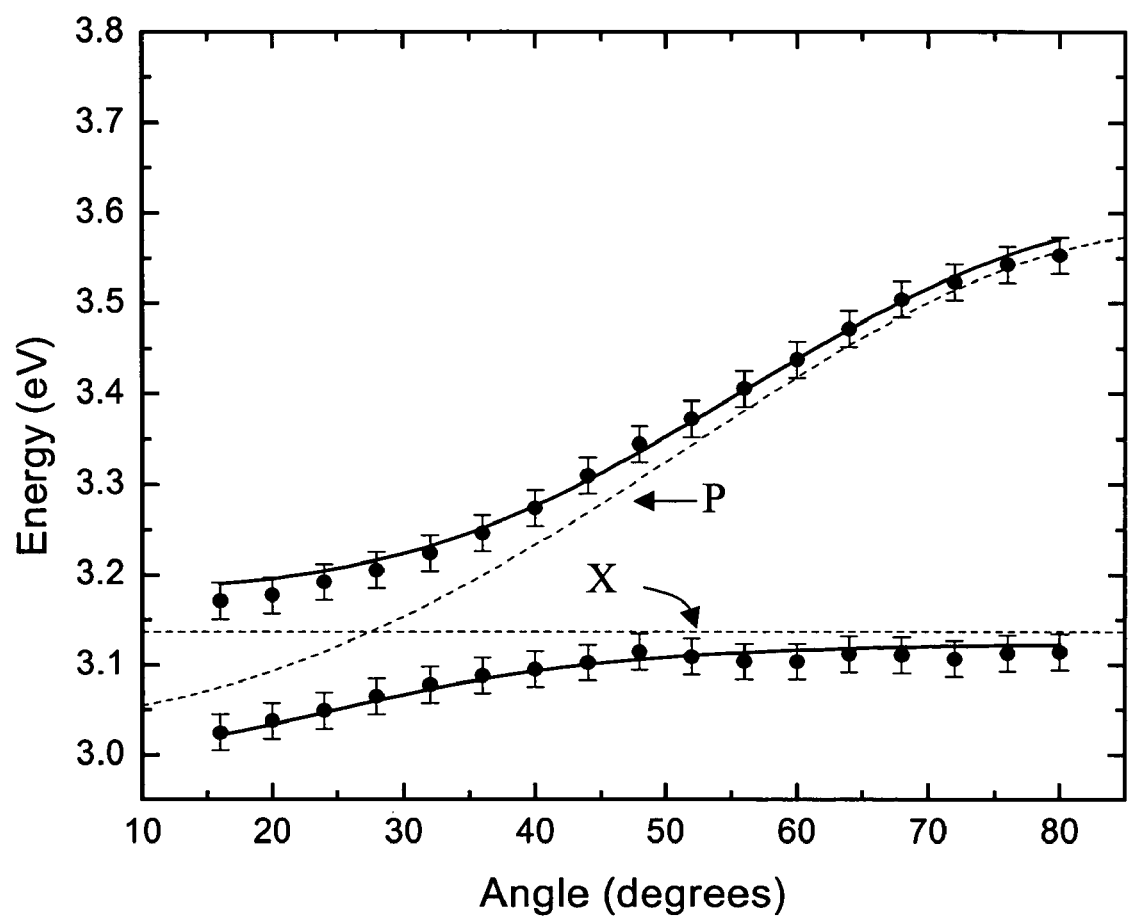
FIG. 5 shows the dispersion relation for an organic microcavity with a 20 nm thick NTCDA active layer. The broken curves are the uncoupled photon (P) and exciton (X) dispersion relations as determined by the fitting parameters of Table I and Eq. (2).

Reflectivity spectra from an OMC containing a 20 nm thick film of NTCDA exhibit two clearly defined features, with anti-crossing at an angle of θ=28° (FIG. 5). Reflectivity peak energies were extracted using Gaussian fits to the multiple absorption features. Both branches of the peak dispersion in FIG. 5 were fit by a conventional two-level interaction Hamiltonian (M. S. Skolnick, T. A. Fisher and D. M. Whittaker, Semicond. Sci. Technol. 13, 645 (1998)), yielding the energy eigenvalues:

$$\varepsilon = \frac{(E_p + E_{ex})}{2} \pm \frac{1}{2}\sqrt{(E_p - E_{ex})^2 + 4V^2} \quad (1)$$

The potential, V, includes the interaction of the exciton and the cavity photon. Here the uncoupled exciton dispersion ($E_{ex}$) is independent of angle, with the cavity photon energy, $E_p$, following Equation 2 (A. Yariv, *Optical Electronics in Modern Communications*, 5th ed. (Oxford University Press, New York, 1997)):

$$E_p = E_0\left(1 - \frac{\sin^2\theta}{n^2}\right)^{-1/2} \quad (2)$$

where the cut-off energy is $E_0$, and n is the effective index of refraction of the uncoupled and non-absorbing cavity. The fits in FIG. 5 were obtained following Eq. (1) and (2) using the parameters listed in Table I, yielding V=(78±2) meV. Since V is related to the normal mode Rabi splitting (i.e. V=Ω/2), then Ω=(156±4) meV.

TABLE I

Model Parameters for 20 nm, 40 nm and 60 nm films[a]

| Thickness (nm) | $E_0$(eV) | n | $V_1$ (meV)[b] | $V_2$ (meV) |
|---|---|---|---|---|
| 20 | 3.04 ± 0.05 | 1.90 ± 0.05 | 78 ± 2 | |
| 40 | 2.88 ± 0.05 | 1.80 ± 0.05 | 140 ± 10 | 50 ± 10 |
| 60 | 2.70 ± 0.05 | 1.60 ± 0.05 | 180 ± 10 | 60 ± 10 |

[a]Best fits were obtained with uncoupled exciton energies fixed at $E_{ex1}$ = 3.14 eV and $E_{ex2}$ = 3.35 eV for all thicknesses.
[b]Rabi splittings are equal to twice the interaction potentials $V_1$ and $V_2$.

Example 2

Figure 7:
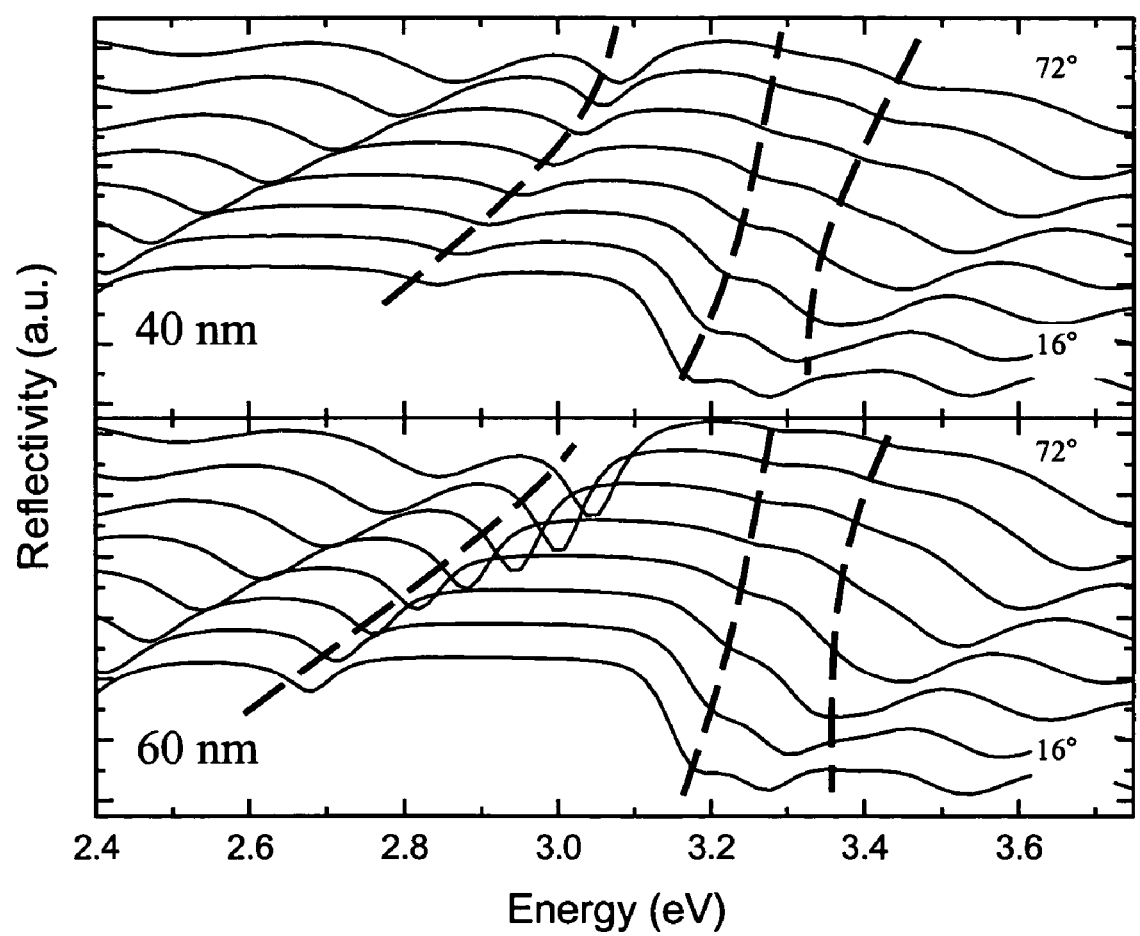
FIG. 7 shows the reflectivity spectra versus angle of incidence, θ, for devices consisting of 40 nm (top) and 60 nm (bottom) thick NTCDA films. Broken lines indicate a third, high energy feature in the dispersion relation consistent with strong coupling to the 0-1 transition of NTCDA.
Figure 8:
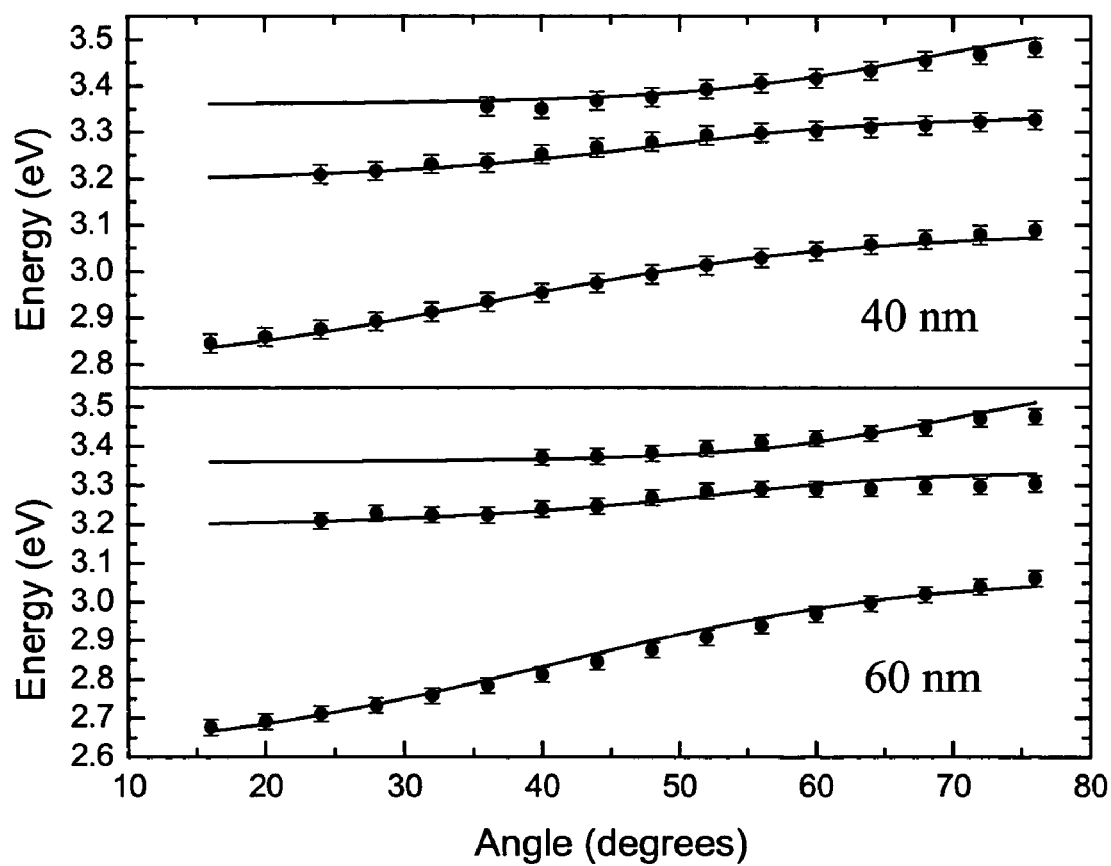
FIG. 8 shows the dispersion relations extracted from the reflectivity spectra in FIG. 7 for the 40 nm and 60 nm thick films. The coupled oscillator model yields splittings of $\Omega_{0-0}=(280\pm20)$ meV and $\Omega_{0-1}=(100\pm20)$ meV for the 40 nm thick film and of $\Omega_{0-0}=(360\pm20)$ meV and $\Omega_{0-1}=(120\pm20)$ meV for the 60 nm thick film.
Figure 9:
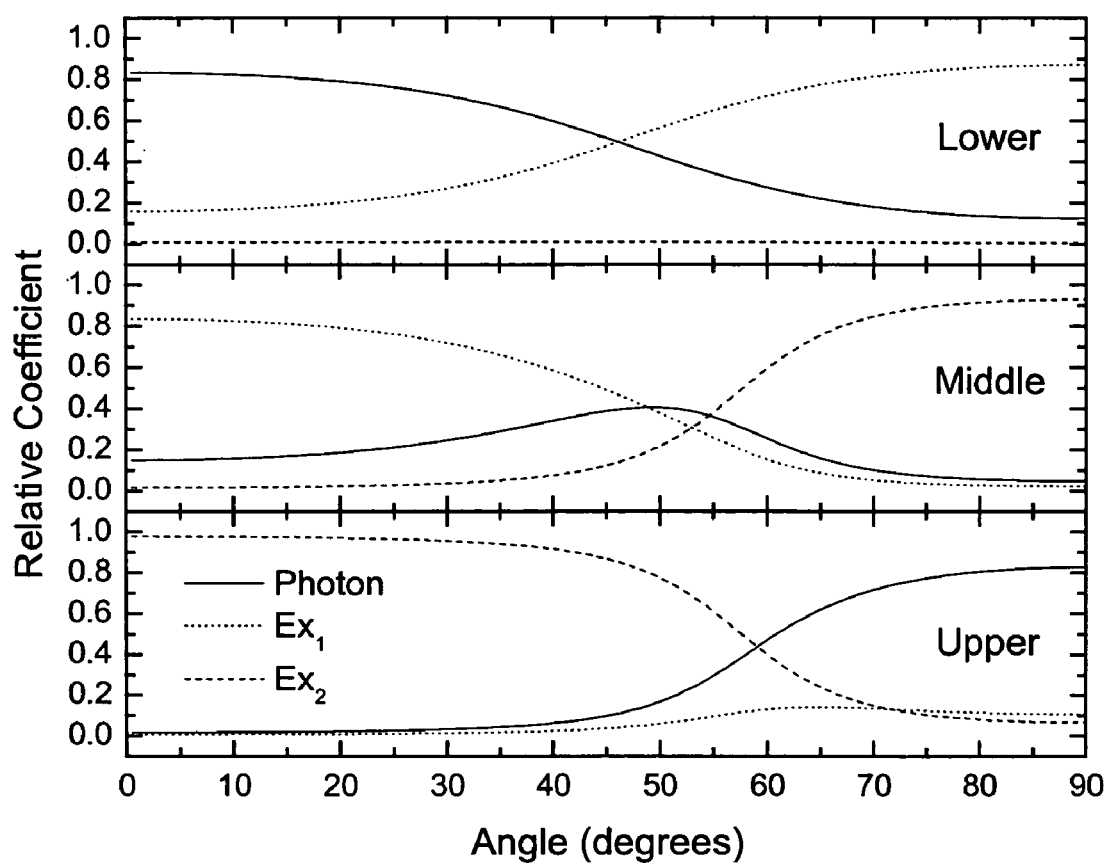
FIG. 9 shows the mixing coefficients $|\alpha|^2$, $|\beta|^2$, and $|\gamma|^2$ extracted from fits to the 40 nm thick film of FIG. 8. The middle branch has significant mixing between both excitons and the cavity photon at θ~50°. The lower and upper branches of the dispersion relation show contributions from the cavity photon and $Ex_1$ for the lower branch and $Ex_2$ for the upper branch.

Microcavities with 40 m and 60 nm thick active layers of NTCDA were fabricated as in Example 1. In general, Ω varies as $(\alpha L)^{1/2}$, where α and L are the absorption coefficient and thickness of the NTCDA layer respectively (C. Weisbuch, M. Nishioka, A. Ishikawa, and Y. Arakawa, Phys. Rev. Lett. 69, 3314 (1992)). Reflectivity spectra collected at selected angles for these microcavities are depicted in FIG. 7. Aside from the features arising from coupling between the cavity mode and the 0-0 transition of NTCDA, a third feature is also observed at higher energy, consistent with coupling to the 0-1 transition of NTCDA, yielding the dispersion relations in FIG. 8. Anti-crossing between branches is observed, and both the middle and upper branches asymptotically approach their respective uncoupled exciton energies at low angle. The middle branch of the dispersion relation for both thicknesses becomes clearly visible at θ>20°, whereas the top branch is observed at θ>35°, where this branch acquires significant photon character (FIG. 9).

The coupled mode formalism can be extended to include a third excitonic oscillator via:

$$\begin{bmatrix} E_p & V_1 & V_2 \\ V_1 & E_{ex1} & 0 \\ V_2 & 0 & E_{ex2} \end{bmatrix} \begin{bmatrix} \alpha \\ \beta \\ \gamma \end{bmatrix} = \varepsilon \begin{bmatrix} \alpha \\ \beta \\ \gamma \end{bmatrix} \quad (3)$$

where α, β, and γ are the mixing coefficients of the new eigenvectors of the strongly coupled system. Here, two interaction potentials ($V_1$, $V_2$) are included in the Hamiltonian as well as two separate uncoupled exciton energy states ($E_{ex1}$, $E_{ex2}$). The energy eigenvalues can be determined numerically to model the dispersion relations of FIG. 3 (solid lines), yielding the parameters in Table I. Here, $E_{ex1}$ is fixed to the value obtained from the 20 nm film, and $E_{ex2}$ is held constant for both the 40 nm and 60 nm films. Branch splittings of $\Omega_{0-0}$=(280±20) meV and $\Omega_{0-1}$=(100±20) meV for the 40 nm film and $\Omega_{0-0}$=(360±20) meV and $\Omega_{0-1}$=(120±20) meV for the 60 nm film scale with thickness following (60 nm/40 nm)$^{1/2}$=1.22, as expected.

In FIG. 9, the mixing coefficients $|\alpha|^2$, $|\beta|^2$, and $|\gamma|^2$ (from Eq. (3)) are plotted versus angle for each branch of the dispersion relation for the 40 nm thick film. The lower branch (top, FIG. 9) has symmetrically varying amounts of cavity photon and $Ex_1$ (0-0 transition) character, with no $Ex_2$ (0-1 transition) mixing. At the point of strongest coupling (θ~50°), there is significant mixing between the cavity photon and both excitons for the middle branch. Equal coupling is never achieved, although sufficient mixing is present to identify the excitonic states as hybridized. Finally, mixing is observed between the cavity photon and $Ex_2$ in the upper branch (bottom, FIG. 9). As the branches extend to large angles, some mixing of the $Ex_1$ state also becomes apparent, likely a result of the strong coupling between the cavity and $Ex_1$.

Strong coupling in a polycrystalline organic material such as NTCDA tests the conventional application of the coupled mode formalism of Eq. (3). In NTCDA, since the cavity photon and exciton modes cannot be separated, it is impossible to define an "empty-cavity" regime between the mirrors. The index of refraction, n, used in Eq. (2) is that found in the absence of the absorber, a decoupled scheme that is not experimentally realizable in NTCDA. Hence, since the excitation is near the dispersion edge of NTCDA, the best fits to the data require that n be decreased slightly with increased film thickness as a result of the lower cavity photon energies intrinsic to thicker cavities.

Note that Eq. (3) assumes that no coupling exists between the 0-0 and 0-1 excitonic states in the absence of the cavity mode. The large splittings between the middle and upper branches (~100 meV) imply Rabi periods on the order of 50 fs, much shorter than the lifetime of typical vibronic transitions (~ps), thus justifying the assumptions that the two excitonic states are largely non-interacting.

In strongly coupled organic microcavities, only a fraction of the photogenerated states are thought to be coherent. For example, in J-aggregates, it has been suggested that there exists a cut-off wavevector for the lower (upper) branch of the dispersion relation above (below) which states are localized and incoherent. These incoherent states are the result of the broad dispersionless character of electronic transitions in organic semiconductors within an OMC. The incoherent state can be excited non-resonantly, and then radiatively transfer energy to resonantly pump coherent states of the lower branch. This avoids the polariton bottleneck that exists in inorganic materials where exciton-phonon coupling is much weaker, and the uncoupled exciton state is itself coherent. In NTCDA, the exciton linewidth (FIG. 5) is large compared with the Rabi splitting, and hence the majority of the excited states at room temperature are incoherent. We have demonstrated strong exciton-photon coupling in organic microcavities consisting of a neat, thermally evaporated, polycrystalline small molecule active layer of NTCDA. Large Rabi splittings are observed, and exciton hybridization between a single cavity mode and two neighboring vibronic transitions of NTCDA is understood using a three-body coupled oscillator framework. In addition to exhibiting large Rabi splittings, thermally evaporated polycrystalline films provide a means for understanding effects of morphology and long range order on the strongly coupled state.

What is claimed is:

1. An organic polariton laser comprising:
   a substrate;
   a resonant polariton microcavity comprising an organic polariton emission layer; and
   a microcavity OLED as an optical pump for the polariton microcavity, wherein the microcavity OLED includes a reflector layer, wherein the emission of the microcavity OLED is directionally focused towards the polariton microcavity, and
   wherein the emission intensity of the microcavity OLED is directionally focused towards a non-orthogonal angle with respect to the microcavity OLED;
   wherein the polariton microcavity and the microcavity OLED form an integrated device structure; and
   wherein the organic polariton laser provides a stimulated source of coherent radiation.

2. The organic polariton laser of claim 1, wherein the resonant polariton microcavity has a Q greater than about 500.

3. The organic polariton laser of claim 1, wherein the polariton microcavity comprises a first reflective layer, the organic polariton emission layer, and a second reflective layer.

4. The organic polariton laser of claim 3, wherein the first reflective layer and the second reflective layer are distributed Bragg reflector layers.

5. The organic polariton laser of claim 4, wherein the distributed Bragg reflector layers each comprise $TiO_2/SiO_2$ multilayer stacks.

6. The organic polariton laser of claim 1, wherein the organic polariton emission layer comprises a pseudoisocyanine.

7. The organic polariton laser of claim 1, wherein the organic polariton emission layer comprises an organic material selected from cyanine dyes, transition metal porpyhrins, a-conjugated polysilanes, and polyaromatic cyclic anhydrides.

8. The organic polariton laser of claim 7 wherein the organic polariton emission layer comprises a polyaromatic cyclic anhydride.

9. The organic polariton laser of claim 8 wherein the organic polariton emission layer comprises 3,4,7,8-naphthalene dianhydride.

10. The organic polariton laser of claim 1, further comprising a dielectric spacer between the resonant polariton microcavity and the microcavity OLED.

11. The organic polariton laser of claim 4, wherein the reflector for the microcavity OLED is a distributed Bragg reflector.

12. The organic polariton laser of claim 1, wherein the emission of the microcavity OLED is tuned to the absorption spectrum of the organic polariton emission layer.

13. The organic polariton laser of claim 1, wherein the emission of the microcavity OLED is directionally focused towards a non-orthogonal angle with respect to the microcavity OLED.

14. The organic polariton laser of claim 1, wherein the peak emission intensity of the microcavity OLED is in the direction of the non-orthogonal angle.

15. The organic polariton laser of claim 7, wherein the organic polariton emission layer is formed by thermal evaporation of the organic material.

16. The organic polariton laser of claim 15, wherein the organic polariton emission layer is crystalline or polycrystalline.

* * * * *